United States Patent
Chen et al.

(10) Patent No.: US 7,923,286 B2
(45) Date of Patent: Apr. 12, 2011

(54) METHOD OF FABRICATING A PHASE-CHANGE MEMORY

(75) Inventors: Yi-Chan Chen, Yunlin County (TW); Wen-Han Wang, Hsinchu (TW)

(73) Assignees: Nanya Technology Corporation, Taoyuan (TW); Windbond Electronics Crop., Hsinchu (TW)

( * ) Notice: Subject to any disclaimer, the term of this patent is extended or adjusted under 35 U.S.C. 154(b) by 0 days.

(21) Appl. No.: 12/611,066

(22) Filed: Nov. 2, 2009

(65) Prior Publication Data
US 2010/0047960 A1    Feb. 25, 2010

Related U.S. Application Data

(62) Division of application No. 12/187,345, filed on Aug. 6, 2008, now Pat. No. 7,670,871, which is a division of application No. 11/552,492, filed on Oct. 24, 2006, now Pat. No. 7,569,845.

(30) Foreign Application Priority Data

Aug. 14, 2006 (TW) .............................. 95129774 A

(51) Int. Cl.
*H01L 21/06* (2006.01)

(52) U.S. Cl. ........ 438/102; 438/282; 438/622; 257/248; 257/528

(58) Field of Classification Search .................. 438/102, 438/282, 622, 624; 257/3, 248, 528, E45.002, 257/E45.003
See application file for complete search history.

(56) References Cited

U.S. PATENT DOCUMENTS

2006/0073662 A1*  4/2006  Jang et al. ..................... 438/299
2006/0197130 A1*  9/2006  Suh et al. ...................... 257/296

\* cited by examiner

*Primary Examiner* — Phuc T Dang

(57) ABSTRACT

A phase-change memory comprises a bottom electrode formed on a substrate. A first isolation layer is formed on the bottom electrode. A top electrode is formed on the isolation layer. A first phase-change material is formed in the first isolation layer, wherein the top electrode and the bottom electrode are electrically connected via the first phase-change material. Since the phase-change material can have a diameter less than the resolution limit of the photolithography process, an operating current for a state conversion of the phase-change material pattern may be reduced so as to decrease a power dissipation of the phase-change memory device.

6 Claims, 8 Drawing Sheets

METHOD OF FABRICATING A PHASE-CHANGE MEMORY

This application is a divisional of U.S. application Ser. No. 12/187,345, filed Aug. 6, 2008, now U.S. Pat. No. 7,670,871, which is a divisional of U.S. application Ser. No. 11/552,492, filed on Oct. 24, 2006, now U.S. Pat. No. 7,569,845 the entire disclosures of which are hereby incorporated by reference.

BACKGROUND OF THE INVENTION

1. Field of the Invention

The invention relates to a memory, and more particularly to a phase-change memory.

2. Description of the Related Art

Phase change memories are non-volatile, have high density, high contrast, high cycling, and low power-consumption, thus, they are an industry semiconductor of choice. Particularly, a phase-change memory with high cell density capable of changing memory states with low current is desirable.

Phase-change materials may exhibit at least two different states, comprising amorphous and crystalline states. Phase-change materials may change from the amorphous to the crystalline state, and back, in response to temperature changes. The states may be distinguished because the amorphous state generally exhibits higher resistivity than the crystalline state. The amorphous state typically involves a more disordered atomic structure, while the crystalline state is an ordered lattice. In general, chalcogenide materials have been widely used in various optical recording media.

The resistance of the phase-change material varies according to whether the phase-change material is in a crystalline state or an amorphous state. In detail, the phase-change material exhibits greater resistance when it is in an amorphous state than when it is in a crystalline state. Therefore, data can be read as logic "0" or logic "1" by detecting current flowing through the phase-change memory when a predetermined voltage applied. That is, data can be stored in a digital form, logic "0" or logic "1", without accumulation of electric charge.

U.S. Pat. No. 6,031,287 and U.S. Pat. No. 6,797,978 disclose horizontal phase-change memory with reduced phase-change material contact area and sufficient current density.

BRIEF SUMMARY OF THE INVENTION

In one embodiment of the invention, the phase-change memory comprises a bottom electrode formed on a substrate. A first isolation layer is formed on the bottom electrode. A top electrode is formed on the isolation layer. A first phase-change material is formed in the first isolation layer, wherein the top electrode and the bottom electrode are electrically connected via the first phase-change material. Since the phase-change material can have a diameter less than the resolution limit of the photolithography process, an operating current for a state conversion of the phase-change material pattern may be reduced so as to decrease a power dissipation of the phase-change memory device.

Methods of manufacturing phase-change memories are also provided. An exemplary embodiment of a method comprises the following steps: forming a bottom electrode on a substrate; forming a first isolation layer on the bottom electrode, wherein the first isolation layer comprises a plurality of first trenches exposing the bottom electrode, and the first trenches extend in a first extension direction; conformably forming a first phase-change material on the first isolation layer and the substrate, wherein the first phase-change material covers the surface of the first trenches; forming a second isolation layer to fill the first trenches; subjecting the first isolation layer, the first phase-change material, and the second isolation layer to a planarization process; forming a plurality of first photoresist patterns extending in an second extension direction parallel to the first extension direction, wherein the first photoresist patterns cover the top surface of the first phase-change material and exposing the top surface of the second isolation layer formed into the first trenches; and etching the first isolation layer, second isolation layer, first phase-change material, and bottom electrode with the first photoresist patterns as a mask exposing the substrate.

According to another exemplary embodiment of the invention, the method of manufacturing phase-change memory comprises the following steps: forming a bottom electrode on a substrate; forming a first isolation layer on the bottom electrode; patterning the first isolation layer so as to form a trench exposing the bottom electrode; conformably forming a phase-change material to cover the surface of the first isolation layer and the trench; etching the phase-change material to leave a phase-change material pillar adjacent to the sidewalls of the trenches; etching the bottom electrode exposed in the trenches to expose the substrate; and forming a second isolation layer to fill the trench.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
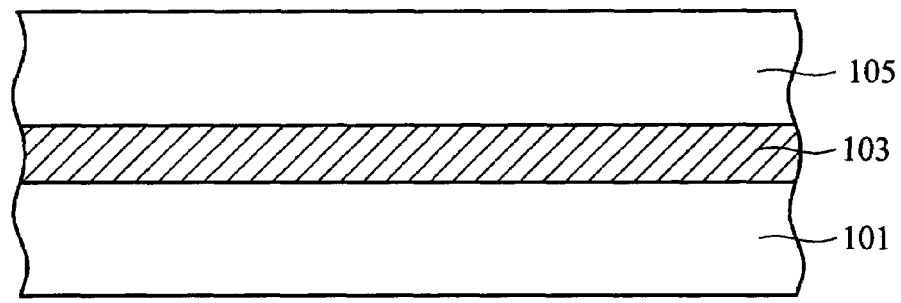
FIGS. 1-8 are cross sections of showing a method of fabricating a phase-change memory according to an embodiment of the invention.

Referring to FIG. 1, a substrate 101 is provided, wherein the substrate 101 can be a semiconductor substrate. Next, a bottom electrode 103 is formed on the substrate 101, wherein the bottom electrode 103 can be TiN, TaN, or TiW, and formed by CVD or sputtering. Next, an isolation layer 105 is formed on the bottom electrode 103. The isolation layer 105 is preferably thicker than the bottom electrode 103. For example, the material of the isolation layer 105 may be borophosphosilicate glass (BPSG), silicon oxide, or silicon nitride, serving as the etching-stop of a subsequent chemical mechanical polishing (CMP) process.

Figure 2:
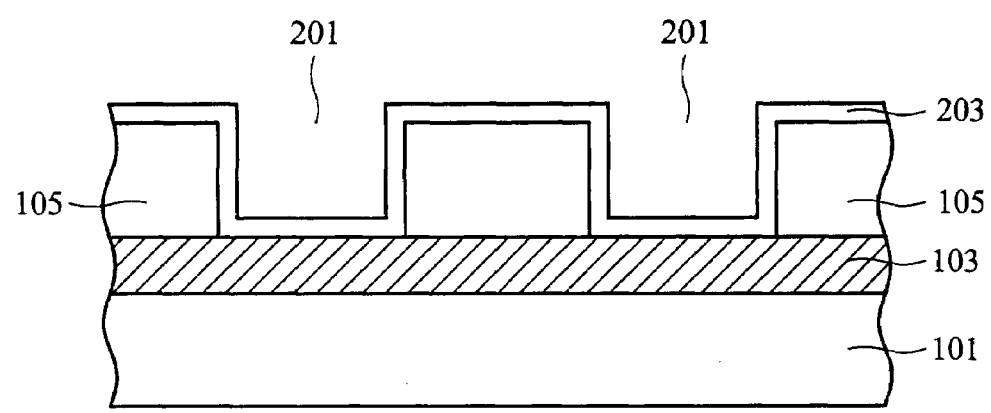

Next, referring to FIG. 2, the isolation layer is patterned by photolithography processes to form a plurality of trenches 201 exposing the bottom electrode 103. Note that the distance between the phase-change materials of memories of the invention depends on the width of the trenches 201. The trench 201 extends in a first extension direction.

Next, a phase-change material 203 is conformably formed on the isolation layer 105 and the bottom electrode 103, completely covering the sidewalls and the bottom of the trenches 201, wherein the phase-change material 203 covers the top surface of the bottom electrode 103 within the trenches 201. The phase-change material 203 can be a chalcogenide material or comprise In, Ge, Sb, Te or combinations thereof, such as GeSbTe or InGeSbTe. Particularly, the thickness of the phase-change material 203 can be 20 nm to 100 nm, preferably 50 nm.

Figure 3:
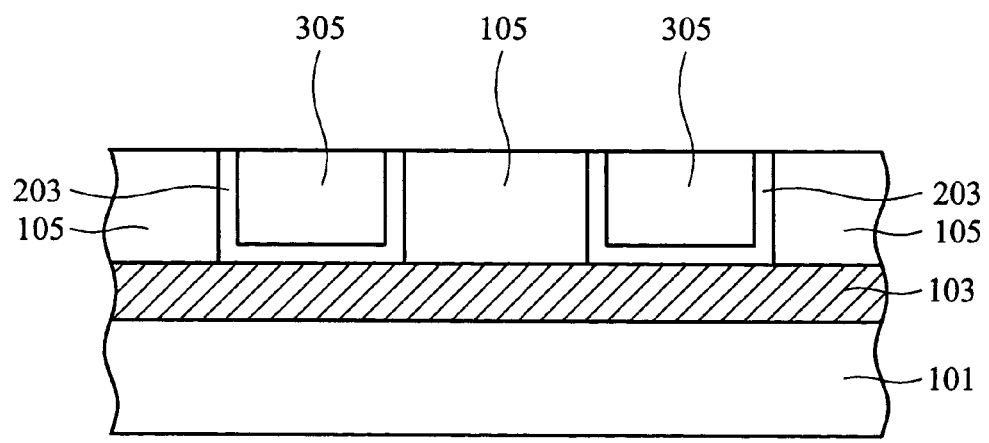

Referring to FIG. 3, an isolation material 305 is filled into the trenches 201 and planarized by a planarization process, such as CMP, leaving coplanar top surfaces of the isolation layer 105, phase-change material 203, and isolation layer 305. For example, the material of the isolation layer 305 can be borophosphosilicate glass (BPSG), silicon oxide, or silicon nitride. Preferably, the material of the isolation layer 305 and the isolation layer 105 is substantially the same. The etching back process may replace the planarization process.

Figure 4:
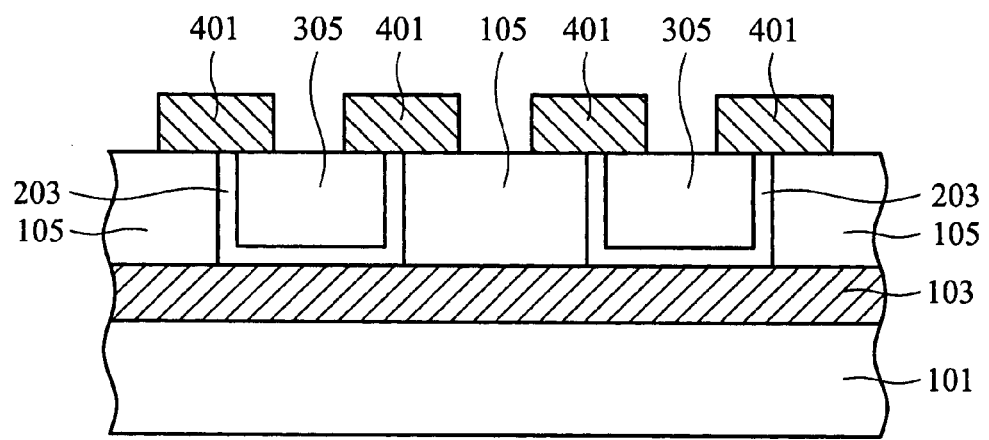

Next, referring to FIG. 4, a photoresist layer is formed on the isolation layer 105, phase-change material 203, and isolation layer 305 and patterned to form a plurality of photoresist patterns 401 extending in a second extension direction parallel to the first direction. The photoresist patterns 401 cover the entire top surface of the phase-change material 203 and partially cover the top surface of the isolation layer 305 and isolation layer 105. The distance between the memories depends on the distance between the photoresist patterns 401.

Figure 5:
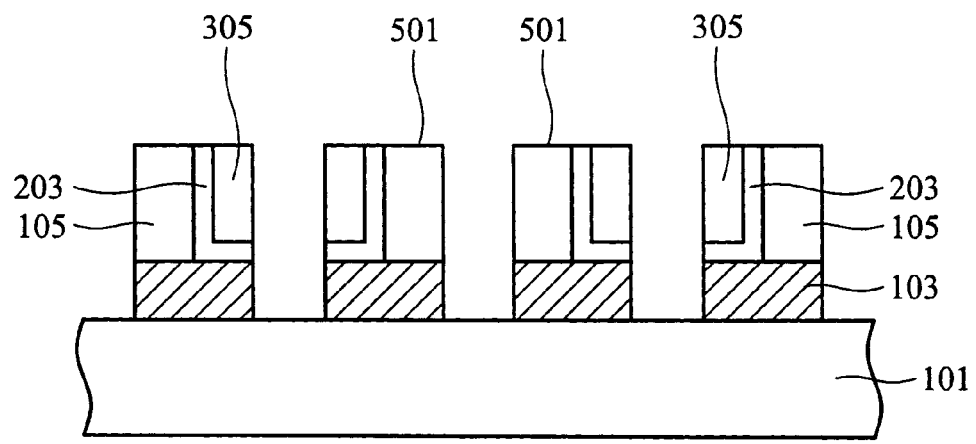

The isolation layer 105, isolation layer 305, phase-change material 203, and bottom electrode 103 are etched with the photoresist patterns as a mask exposing the substrate 101, completing the structure 501 as shown in FIG. 5. It should be noted that the phase-change material 203 is formed between the isolation layer 105 and isolation layer 305 and is L-shaped or J-shaped and electrically connects to the bottom electrode 103.

Figure 6:
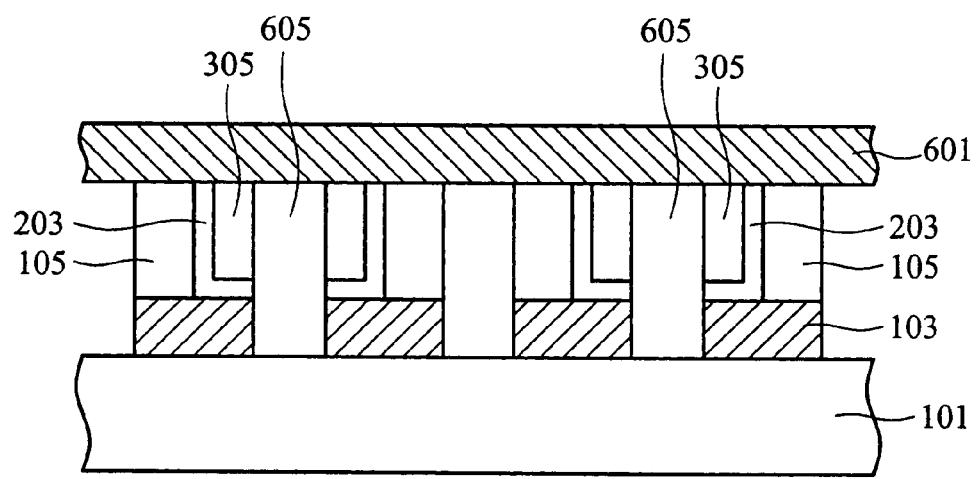

Referring to FIG. 6, an isolation layer 605 is filled into the openings between the stacked structures 501. For example, the material of the isolation layer 605 can be borophosphosilicate glass (BPSG), silicon oxide, or silicon nitride. Preferably, the material of the isolation layer 605 and the isolation layer 105 is substantially the same. The isolation layer 105, phase-change material 203, isolation layer 305, and isolation layer 605 are planarized by a planarization process, such as chemical mechanical polishing, resulting in coplanar top surfaces of the isolation layer 105, phase-change material 203, isolation layer 305, and isolation layer 605.

Figure 7:
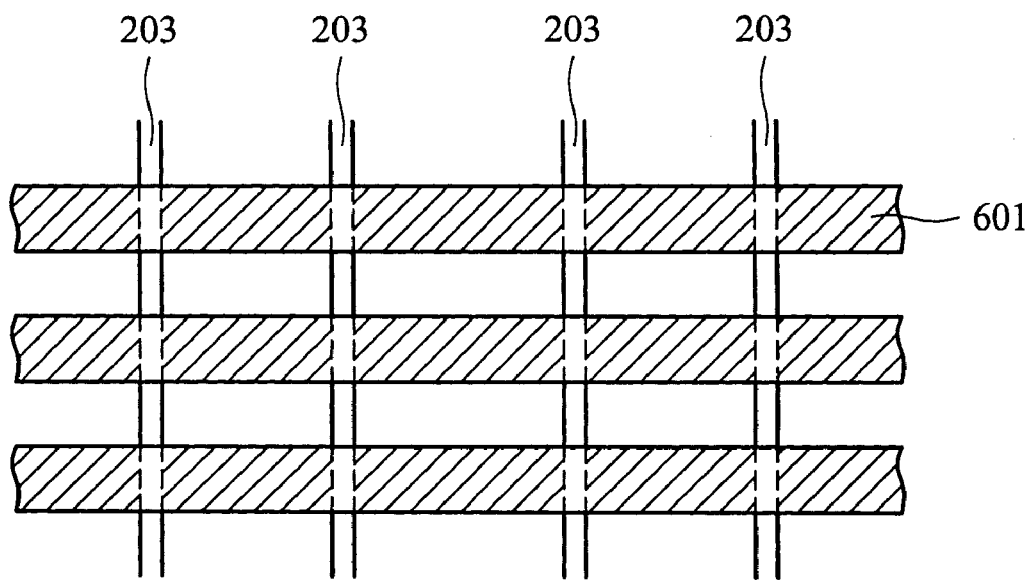

Still referring to FIG. 6, a photoresist layer is formed on the isolation layer 105, phase-change material 203, isolation layer 305 and isolation layer 605, and patterned to form a plurality of photoresist patterns 601 extending in a third extension direction perpendicular to the first direction. FIG. 7 shows the top-view of FIG. 6. The width W of the photoresist patterns 601 is preferably the same as the resolution limit of photolithography process, resulting in reducing the top area of the phase-change material and increasing the current density of the phase-change memory.

Figure 8:
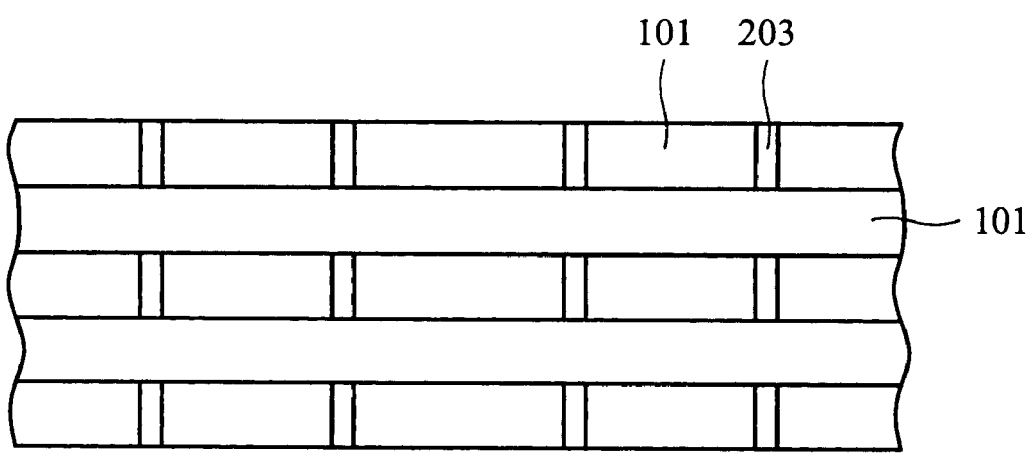

The isolation layer 105, isolation layer 305, isolation layer 605, phase-change material 203, and bottom electrode 103 are etched with the photoresist patterns 601 as a mask exposing the substrate 101. FIG. 8 shows the top-view of the described structure.

In another embodiment, the order of forming the photoresist patterns 401 and the photoresist patterns 601 can be changed. Referring to FIG. 3, after performing the first planarization, the photoresist patterns extending in a extension direction perpendicular to the first direction can be formed on the isolation layer 105, phase-change material 203, and isolation layer 305. After etching and deposition of the isolation, the photoresist patterns extending in a extension direction parallel to the first direction are then formed.

Figure 9:
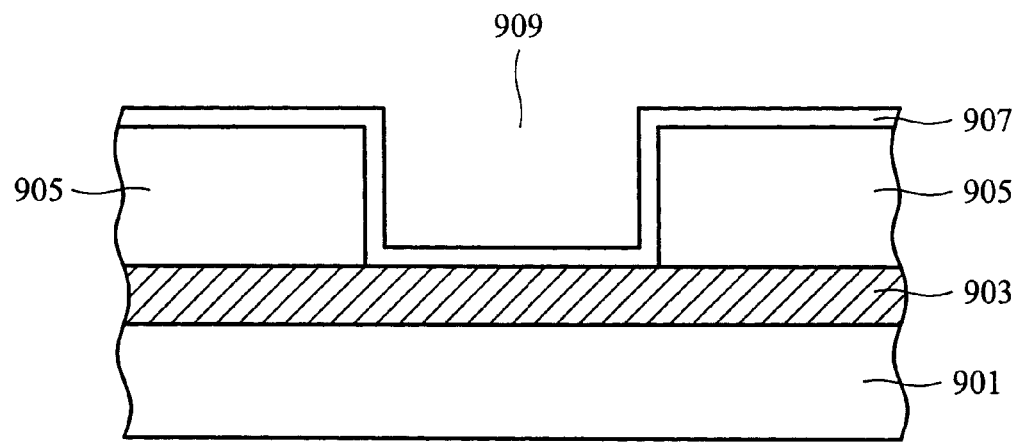
FIGS. 9-11B are cross sections of showing a method of fabricating a phase-change memory according to another embodiment of the invention.

A method of fabricating a phase-change memory is also provided. Referring to FIG. 9, a conducting layer 903 and an isolation layer 905 are formed on a substrate 901.

Suitable materials for the conducting layer 903 can be TiN, TaN, or TiW, serving as the bottom electrode of the invention. For example, the material of the isolation layer 905 may be borophosphosilicate glass (BPSG), silicon oxide, or silicon nitride. Next, the isolation layer 905 is patterned to form a plurality of trenches 909 exposing the conducting layer 903

A phase-change material 907 is conformably formed on the isolation layer 905 and the conducting layer 903, completely covering the sidewalls and the bottom of the trenches 909, wherein the phase-change material 907 cover the top surface of the conducting layer 903 within the trenches 909. The phase-change material 907 can be chalcogenide material or comprise In, Ge, Sb, Te or combinations thereof, such as GeSbTe or InGeSbTe. Particularly, the thickness of the phase-change material 907 can be 20 nm to 100 nm, preferably 50 nm.

Figure 10:
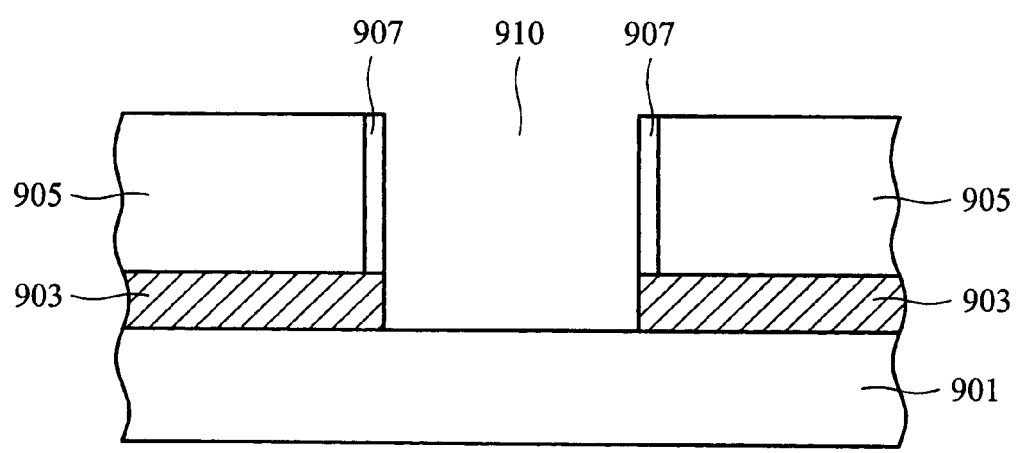

Referring to FIG. 10, the phase-change material 907 is etched by an anisotropic etching to remain a phase-change material pillar adjacent to the sidewalls of the trenches. Next, the conducting layer 903 within the trenches 909 is etched to form openings 910 exposing the substrate 901.

Figure 11A:
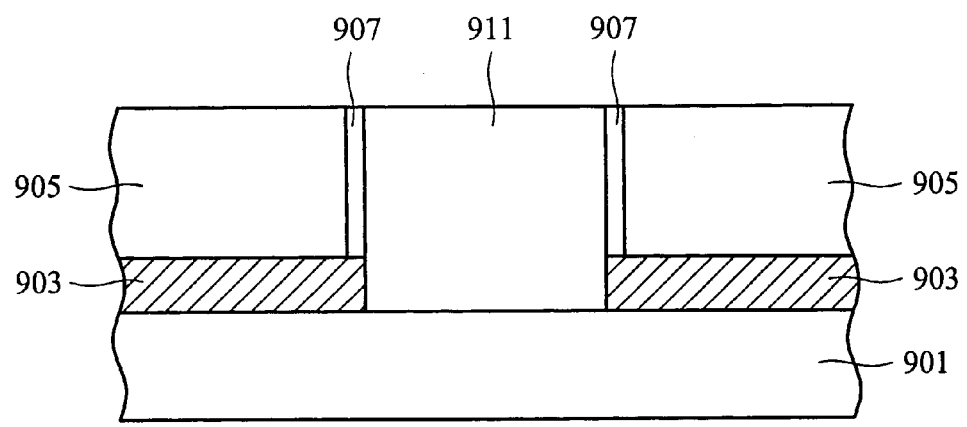
Figure 11B:
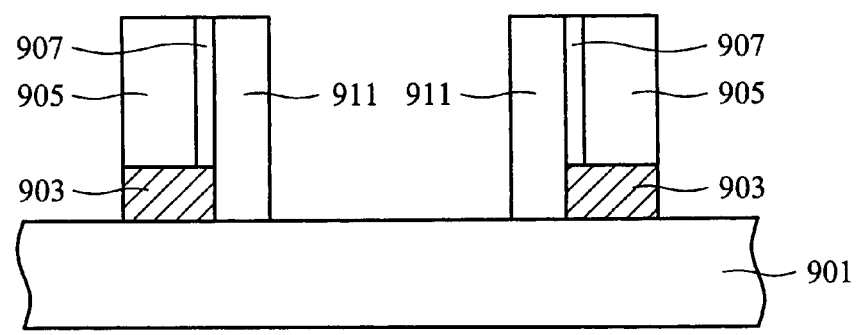
Figure 12:
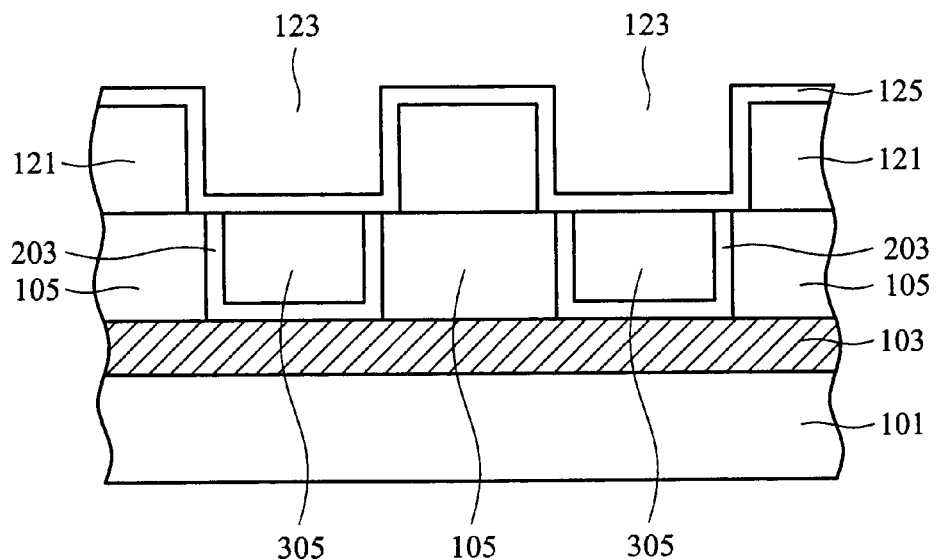
FIGS. 12-15 are cross sections of showing a method of fabricating a three-dimensional phase-change memory according to yet another embodiment of the invention.

Next, referring to FIG. 11A, an isolation layer 911 is formed to fill the openings 910, and planarized by a planarization process, such as chemical mechanical polishing, leaving coplanar top surfaces of the isolation layer 905, phase-change material 907, and isolation layer 911. For example, the material of the isolation layer 911 may be borophosphosilicate glass (BPSG), silicon oxide, or silicon nitride. Referring to FIG. 11B, the described structure is subjected to the process as disclosed in FIGS. 6~8, thus, fabrication of the phase-change memory is complete. Particularly, the phase-change material pillar is formed between the isolation layer 905, and isolation layer 911, and the profile of the phase-change material pillar is I-shaped.

In some embodiments of the method for fabricating a three-dimensional phase-change memory comprises: after planarization process as disclosed in FIG. 3, an isolation layer 121 is formed on the isolation layer 105, phase-change material 203, and isolation layer 305. For example, the material of the isolation layer 121 can be borophosphosilicate glass (BPSG), silicon oxide, or silicon nitride. Next, the isolation layer 121 is patterned to form a plurality of trenches 123, wherein the trenches 123 are parallel to and directly over the trenches 201. Particularly, the width of the trenches 123 can be the same as the trenches 201, and the trenches 123 and trench 201 extend to a first extension direction.

A phase-change material 125 is formed conformably on the isolation layer 121 and the trenches 123, wherein the phase-change material 125 cover the sidewalls and the bottom of the trenches 125. An isolation layer 131 is filled into the trenches 123. For example, the material of the isolation layer 131 can be borophosphosilicate glass (BPSG), silicon oxide, or silicon nitride.

The isolation layer 121, phase-change material 125, and isolation layer 131 are planarized by a planarization process, such as chemical mechanical polishing, leaving coplanar top surfaces of the isolation layer 121, phase-change material 125, and isolation layer 131. The etching back process may replace the planarization process.

Figure 13:
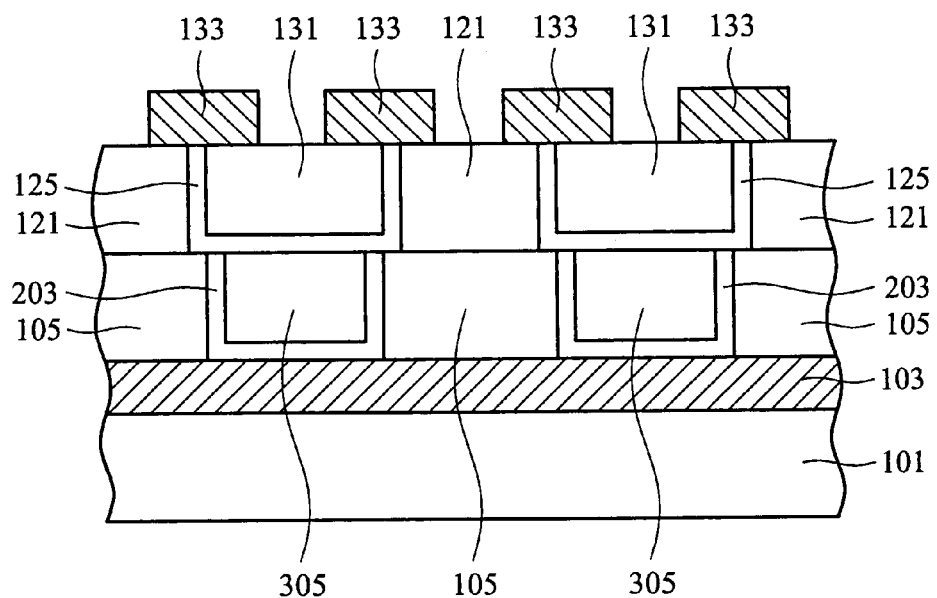

Referring to FIG. 13, after planarization, a photoresist layer is formed on the isolation layer 121, phase-change material 125, and isolation layer 131, and patterned to form a plurality of photoresist patterns 133 extending in a second extension direction parallel to the first extension direction.

The photoresist patterns 133 cover the entire top surface of the phase-change material 203 and phase-change material 125 adjacent to the sidewalls of the trenches 201 and trenches 123 and cover a partial top surface of the isolation layer 131 and isolation layer 121.

Figure 14:
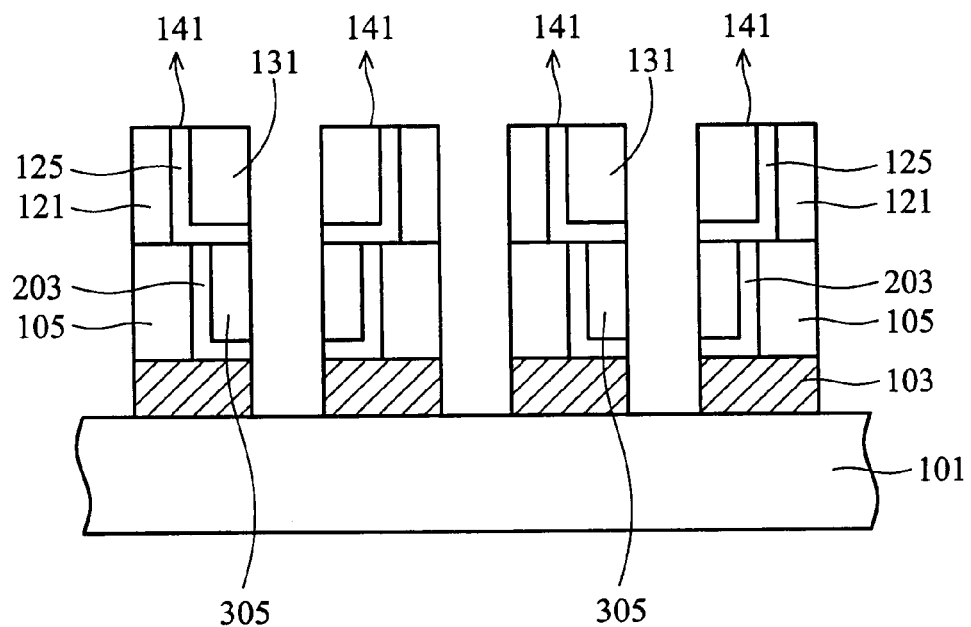

Next, referring to FIG. 14, the isolation layer 121, isolation layer 131, phase-change material 203, phase-change material 125, isolation layer 105, isolation layer 301 and bottom electrode 103 are etched with the photoresist patterns 133 as a mask exposing the substrate 101, forming a plurality of stacked structures 141. The phase-change material 125 is formed between the isolation layer 131 and isolation layer 121, and phase-change material 203 is formed between the isolation layer 301 and isolation layer 105. The phase-change material 125 and phase-change material 203 are L-shaped or ]-shaped, electrically connecting each other. Further, a conducting layer (not shown), such as TiN, TaN, or TiW, can be formed between the phase-change material 125 and phase-change material 203, serving as an electrode. Preferably, since the phase-change material 125 and phase-change material 203 comprise different materials, data can be read in logic "10", logic "01", logic "00", or logic "11" by detecting current flowing through the phase-change memory when a predetermined voltage applied, thereby increasing the memory density thereof.

Figure 15:
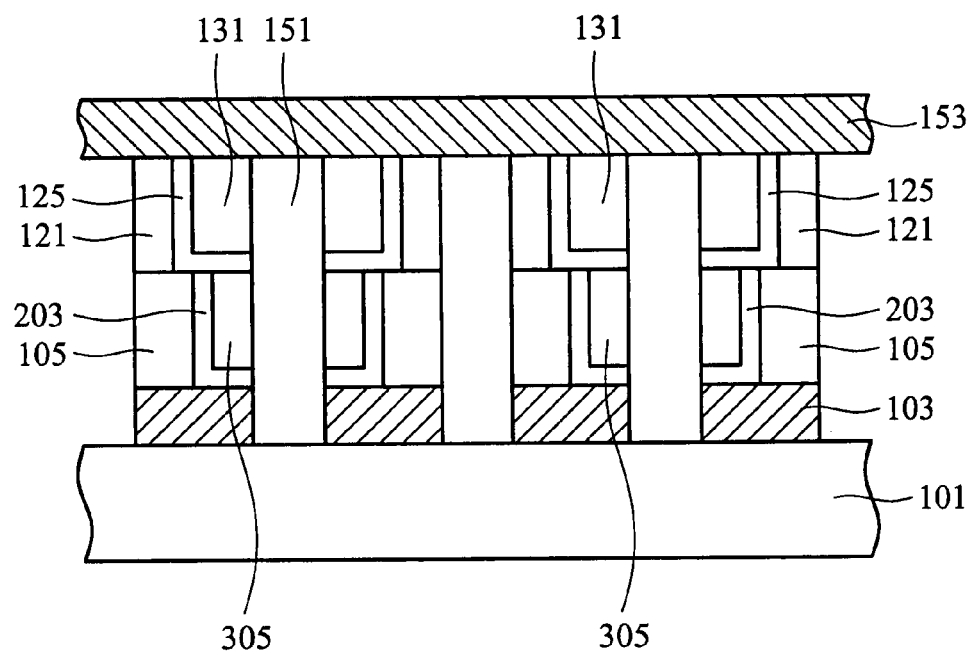

Next, referring to FIG. 15, an isolation layer 151 is formed on the substrate to fill the space between the stacked structures 141, and planarized by a planarization process, such as chemical mechanical polishing, leaving coplanar top surfaces of the isolation layer 121, isolation layer 131, isolation layer 151, and isolation layer 125. For example, the material of the isolation layer 151 can be borophosphosilicate glass (BPSG), silicon oxide, or silicon nitride.

Next, a photoresist layer is formed on the above structure to form a plurality of photoresist patterns 153 extending in a third extension direction perpendicular to the first direction. The top-view of the aforementioned structure is the same as the FIG. 7.

The width of the photoresist patterns 153 is preferably the same as the resolution limit of photolithography process, resulting in reducing the top area of the phase-change material and increasing the current density of the phase-change memory.

The isolation layer 121, isolation layer 131, isolation layer 105, isolation layer 301, phase-change material 125, phase-change material 203, and bottom electrode 103 are etched with the photoresist patterns 153 as a mask exposing the substrate 101. FIG. 8 shows the top-view of the above structure.

After removing the photoresist patterns 153, a conducting layer is formed on the top surface of the phase-change material 125 for electrical connection thereto. Next, the conducting layer is etched to form a plurality of top electrodes extending in a fourth extension direction perpendicular to the first extension direction.

Accordingly, the contact area between the phase-change material and top electrode depends on the deposition thickness of the phase-change material and the width of the photoresist patterns. Therefore, the phase-change material can have a diameter less than the resolution limit of the photolithography process. As a result, an operating current for a state conversion of the phase-change material pattern may be reduced so as to decrease a power dissipation of the phase-change memory device. In addition, because the operating current decreases, sizes of other discrete devices (e.g., MOS transistor) of the phase-change memory device may also be decreased. Therefore, the phase-change memory device may be suitable for high integration.

Moreover, in an embodiment of the invention, the phase-change memories have four kinds of logic single, thereby increasing the memory density thereof.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a phase-change memory, comprising:
    forming a bottom electrode on a substrate;
    forming a first isolation layer on the bottom electrode;
    patterning the first isolation layer so as to form a trench exposing the bottom electrode;
    conformably forming a phase-change material to cover the surface of the first isolation layer and the trench;
    etching the phase-change material to leave a phase-change material pillar adjacent to the sidewalls of the trenches;
    etching the bottom electrode exposed in the trenches to expose the substrate, such that a sidewall of the phase-change material adjacent to the trench is aligned to a sidewall of the bottom electrode adjacent to the trench; and
    forming a second isolation layer to fill the trench.

2. The method as claimed in claim 1, further comprising forming a top electrode on the phase-change material.

3. The method as claimed in claim 1, wherein the profile of the phase-change material is l-shaped.

4. The method as claimed in claim 1, wherein the phase-change material comprises chalcogenide material.

5. The method as claimed in claim 1, wherein the first isolation layer comprises borophosphosilicate glass (BPSG), silicon oxide, or silicon nitride.

6. The method as claimed in claim 1, wherein the first isolation layer and the second isolation layer comprise substantially the same material.

* * * * *